(12) United States Patent
Mehrod et al.

(10) Patent No.: US 7,906,394 B1
(45) Date of Patent: Mar. 15, 2011

(54) IMPLANTED VERTICAL SOURCE-LINE UNDER STRAIGHT STACK FOR FLASH EPROM

(75) Inventors: Freidoon Mehrod, Plano, TX (US); Kyle A. Picone, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 760 days.

(21) Appl. No.: 09/594,118

(22) Filed: Jun. 14, 2000
(Under 37 CFR 1.47)

Related U.S. Application Data

(62) Division of application No. 09/120,712, filed on Jul. 22, 1998.

(51) Int. Cl.
*H01L 21/336* (2006.01)
*H01L 21/425* (2006.01)

(52) U.S. Cl. ......... 438/257; 438/197; 438/262; 438/528

(58) Field of Classification Search .................. 438/257, 438/197, 201, 263, 268, 289, 259, 553, 552, 438/528; 287/315, 328; 365/185.05, 185.11, 365/185.16
See application file for complete search history.

(56) References Cited

U.S. PATENT DOCUMENTS

| 5,659,500 | A | * | 8/1997 | Mehrad | 365/185.05 |
| 5,858,839 | A | * | 1/1999 | Kaya et al. | 438/257 |
| 6,043,122 | A | * | 3/2000 | Liu et al. | 438/257 |
| 6,072,212 | A | * | 6/2000 | Kaya et al. | 257/315 |
| 6,243,293 | B1 | * | 6/2001 | Van Houdt et al. | 365/185.14 |
| 6,312,989 | B1 | * | 11/2001 | Hsieh et al. | 438/257 |

* cited by examiner

*Primary Examiner* — Michael S. Lebentritt
(74) *Attorney, Agent, or Firm* — Wade J. Brady, III; Frederick J. Telecky, Jr.

(57) ABSTRACT

In FLASH EPROM cells, source diffusion continuity between horizontal and vertical source lines is provided by an arsenic implant under the stack in vertical source lines.

5 Claims, 4 Drawing Sheets

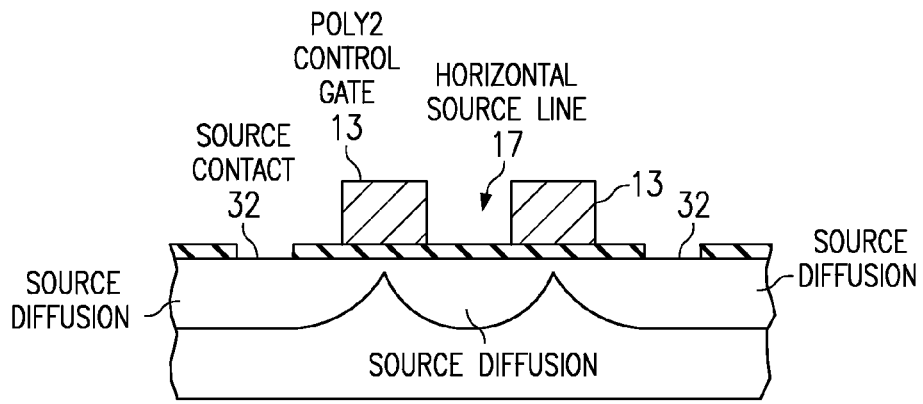
FIG. 5
FIG. 6
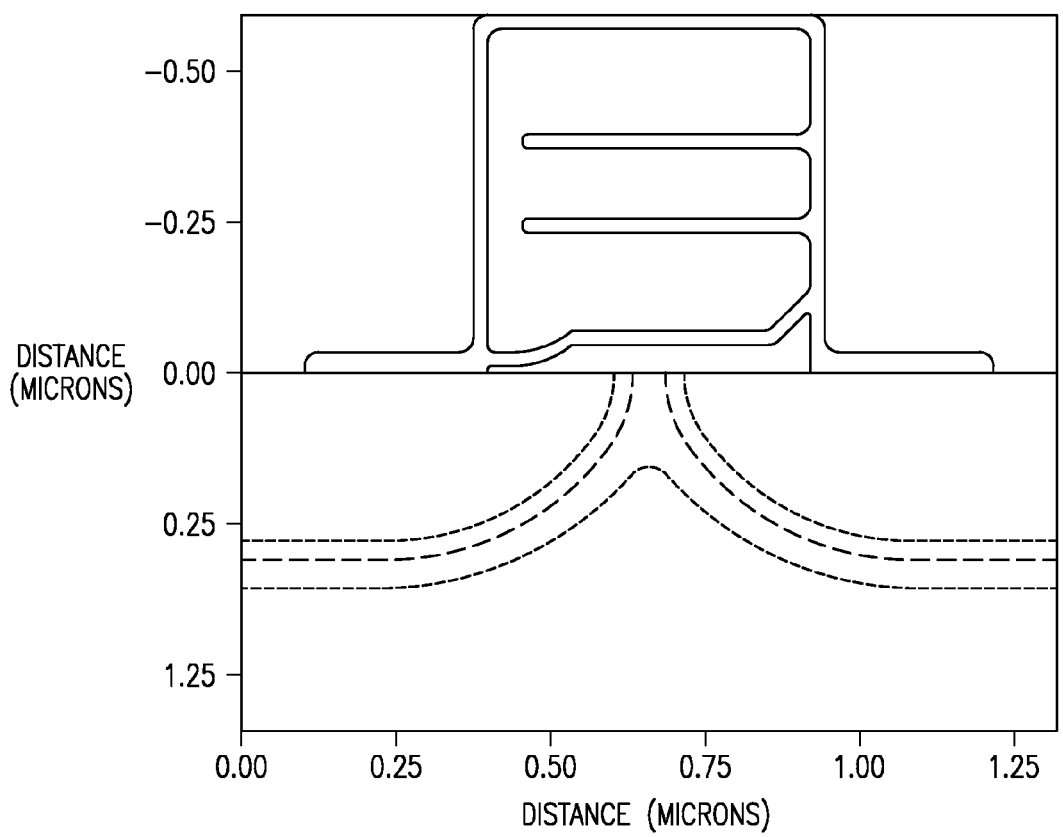

IMPLANTED VERTICAL SOURCE-LINE UNDER STRAIGHT STACK FOR FLASH EPROM

CROSS REFERENCE TO PRIOR APPLICATIONS

This application is a division of Ser. No. 09/120,712, filed Jul. 22, 1998 from which priority is claimed under 35 U.S.C. 120.

BACKGROUND AND SUMMARY OF THE INVENTION

The present invention relates to integrated circuit structures and fabrication methods, and especially to the fabrication of non-volatile FLASH memory array.

Background: FLASH EPROM Layout

FLASH memory (also known as FLASH EPROM or FLASH EEPROM) is an array of transistors which have floating gates. The arrays can be written cell by cell, but are erased as blocks of cells or as an entire array.

Referring to FIG. 7, a sample array of memory cells, which is an integral part of a memory chip, is shown. Each cell is a floating-gate transistor 10 having a source 11, a drain 12, a floating gate 13, and a control gate 14. Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a common-column line 17a to a column decoder 19 and each of the drain-column lines 18 is connected to the column decoder 19. Further discussion of the array can be found in U.S. Pat. No. 5,689,500, which is hereby incorporated by reference.

As dimensions are scaled down in all areas of integrated circuits, the trend in FLASH arrays has been to eliminate as many source/drain contact points as possible, thus avoiding the extra space needed for these structures. A typical FLASH array layout is shown in FIG. 8. Here there are drain contacts 34' for each transistor 10, while a single source contact 32' is made to serve many cells (e.g. 32). As shown in this figure, LOCOS or field isolations 30' are not continuous for older generations with bigger cells, but at 0.5 micron and below, the LOCOS isolations are continuous. In the latter situation, the thermally grown oxide is removed along the horizontal source-line 17', by etching, then dopants are implanted and annealed in a self-aligned source (SAS) process, providing the conduction necessary between the source contact and the individual cells.

Vertical source lines 17A' cross the horizontal source lines at the source contact 32' and are electrically connected to the contact 32' through metal leads and not through the moat under the stack since the diffused source implants might not reach through under the stack. Note that the stacks are designed to "bend" around the locations where a source contact is planned, to accommodate the large area needed for the source contact.

Beside the larger space needed, bent stacks cause various problems. The horizontal spacing between field oxide regions is non-uniform (it has to be wider at the vertical source lines than the horizontal spacing in the groups of columns of cells), causing distortion around the vertical source lines. In some cases, the distortion is sufficient that dummy columns of cells are used on each side of the metal vertical source line, resulting in an even larger non-functional area.

Background: In-Line Contacts

In U.S. Pat. No. 5,659,500, it was proposed that the source contacts 32 be moved to the other side of the control gate line 15 to be in line with drain contacts 34 as shown in FIG. 4. FIG. 5, showing cross section A-A' of FIG. 4, reflects the diffusion of dopants from both sides of the stack. This diffusion method shows a good conduction path under the stack, to connect the horizontal source-line to the contact on the vertical source line, for 0.7 micron stack width where there are no boron implants on the source-lines. In these conditions, phosphorus can diffuse from both side (more than half-way), making a conductive path under the stack. Since the stack width is 0.7 micron, even if the source junction diffusion is more than half way in the channel, there is still about 0.3 micron effective channel length (Leff) left to prevent punch-through in the Floating Gate, Avalanche-injection MOS (FAMOS) cell. But as the stack gets smaller (0.4-0.5 micron), in order to keep a reasonable Leff, the source junction needs to be pulled back so that the above approach may not work. For 0.4 micron stack, the diffusion junctions may not give a good conductive path, a simulation of which is shown in FIG. 6.

Disclosed Structures and Methods

The present application discloses that, when moving source contacts in line with drain contacts, rather than counting on source diffusions to achieve a good conductive path, an extra arsenic implant can be done right after the poly 1 slot etch and before ashing the resist, to place the arsenic under the soon-to-be-deposited control line. The mask for the poly 1 slot etch can be slightly modified, so that the etch also removes poly 1 at the point where the control gate line will cross the vertical source line, eliminating the need for an additional mask. FIG. 1 shows a layout similar to FIG. 4, with the additional implant shown at 40. FIG. 2 shows a cross-section along B-B' in FIG. 1, showing how the disclosed arsenic implantation ensures good conduction under the to connect the vertical and horizontal source lines.

Advantages of the disclosed methods and structures include:
   requires less area (about 2% less);
   straight stacks are more manufacturable;
   straight stacks are more scalable;
   no dummy columns are needed around the vertical source lines; and
   this approach is independent of line width.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 5 shows a cross-section along A-A' in FIG. 4, using the diffused source method.

FIG. 6 shows a simulation of the diffusion method under the stack as dimensions shrink.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview

Figures 1, 2:
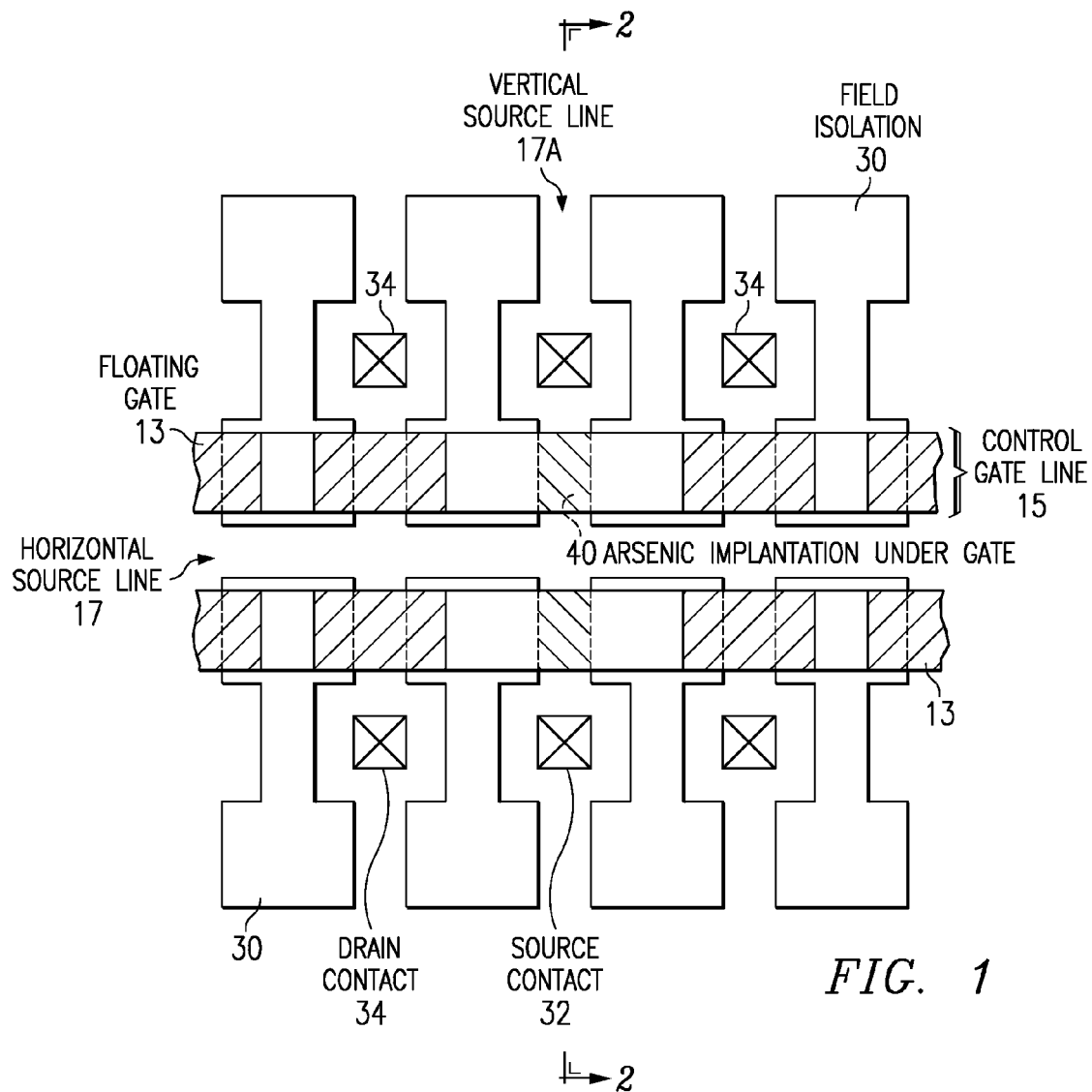
FIG. 1 shows the disclosed layout, highlighting the areas of the array which are implanted with arsenic prior to forming the control gate line.
FIG. 2 shows a cross-section along B-B' in FIG. 1, using the disclosed arsenic implantation.
Figure 3:
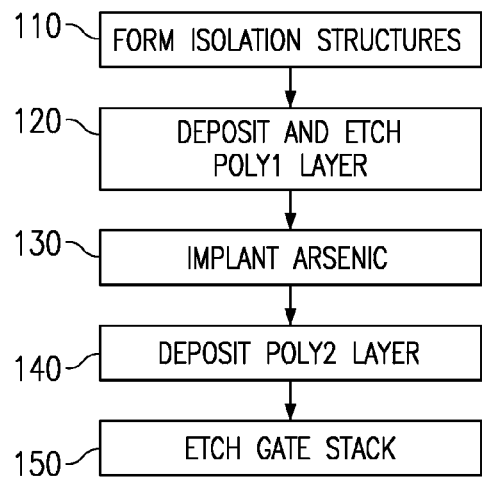
FIG. 3 shows a partial flow for fabricating FLASH EPROM according to the present invention.

FIG. 3 shows a partial flow for fabricating a FLASH EPROM array, and will be explained in conjunction with FIG. 1. Processes used to make the array will tend to vary somewhat, depending on whether or not the array is embedded in a chip with logic circuits. In either case, the process starts with the formation (step 110) of isolation structures 30. Typically, these will be either grown field oxide (LOCOS) structures or deposited, shallow trench isolation (STI) structures.

This is followed by the deposition and etch (step 120) of a first polysilicon layer, which will form the floating gates 13. When diffusion under the stack is used, the poly 1 etch step typically removes only regions of poly 1 from over the isolation structure, to separate the individual floating gates 13, where the width of poly 1 removed is defined by the minimum lithographic distance. In the disclosed process, however, the mask is altered so that the polysilicon is also removed over at least that portion 40 of the vertical source line which will lie under the control gate line. Generally, the poly 1 which overlies the isolation structure immediately adjacent to region 40 will also be removed. Optionally, the entire vertical source line can be included in this etch.

Then, before the etch mask is ashed, an appropriate dopant is implanted through the mask (step 130), to insure conduction under the stack after manufacture is complete. Generally, this dopant will be arsenic, to prevent diffusion away from the stack during further processing.

After arsenic implantation, a second polysilicon layer is deposited (step 140), followed by etch of the entire gate stack (step 150). After the stack is formed, conventional processing will be used to implant the source and drain areas, and to form contacts and metallizations as needed. FIG. 2 shows a cross-section of FIG. 1 along B-B', showing the disclosed implantation of arsenic under the control gate and the line of conduction created.

First Embodiment

LOCOS

Figure 4:
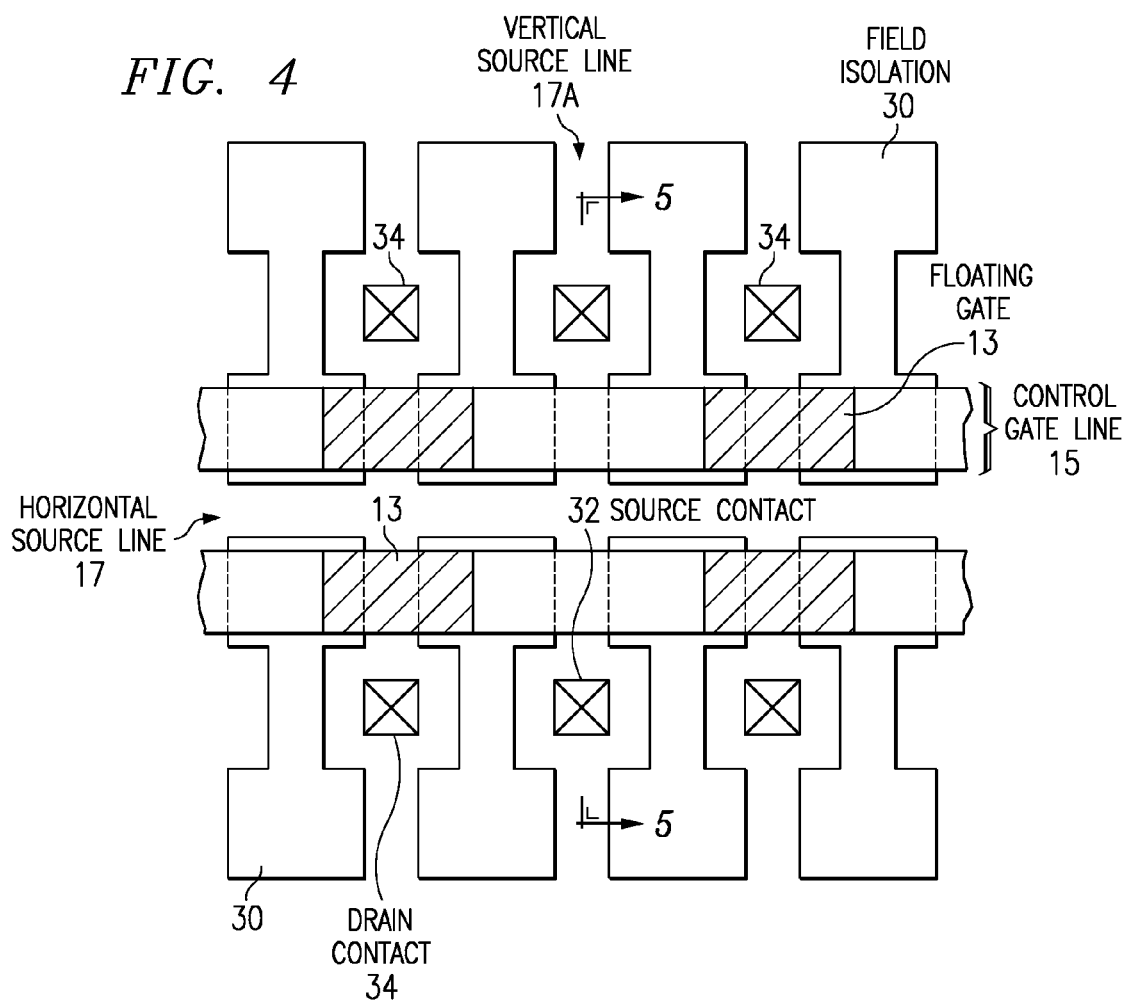
FIG. 4 shows a layout which can use either the disclosed process or diffusion under the gate.
Figure 7:
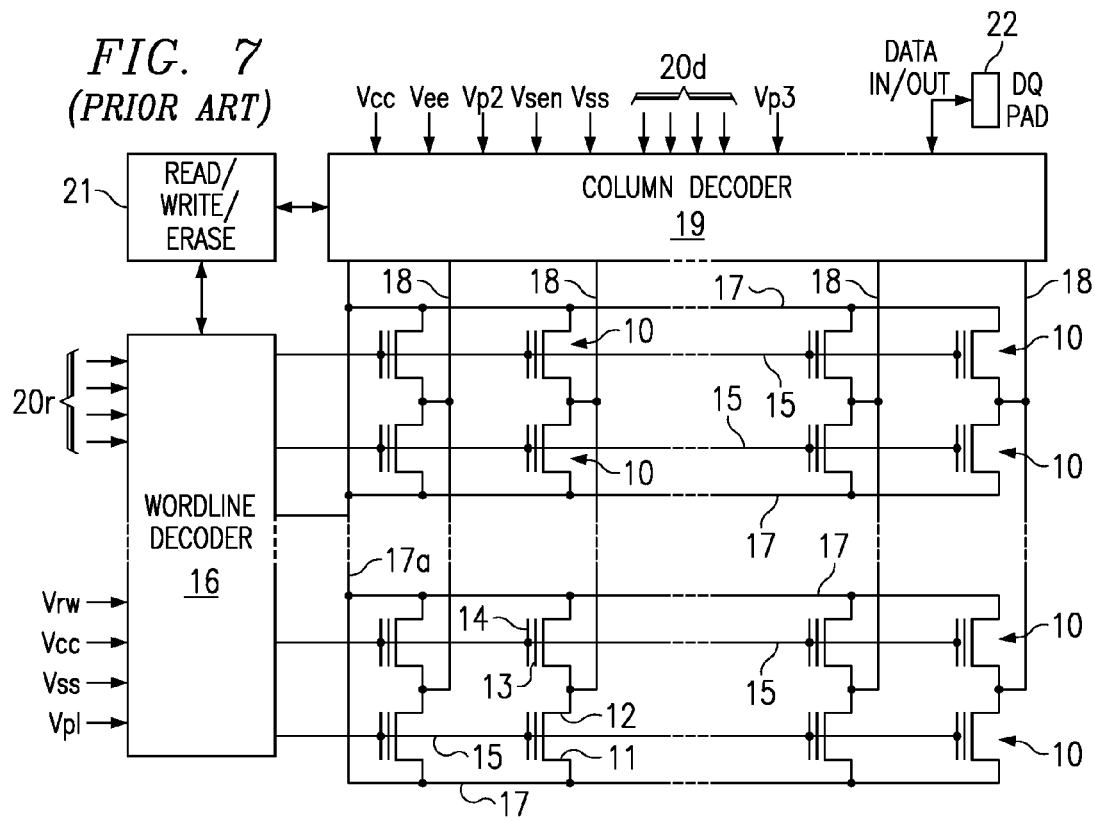
FIG. 7 shows a sample array of memory cells.
Figure 8:
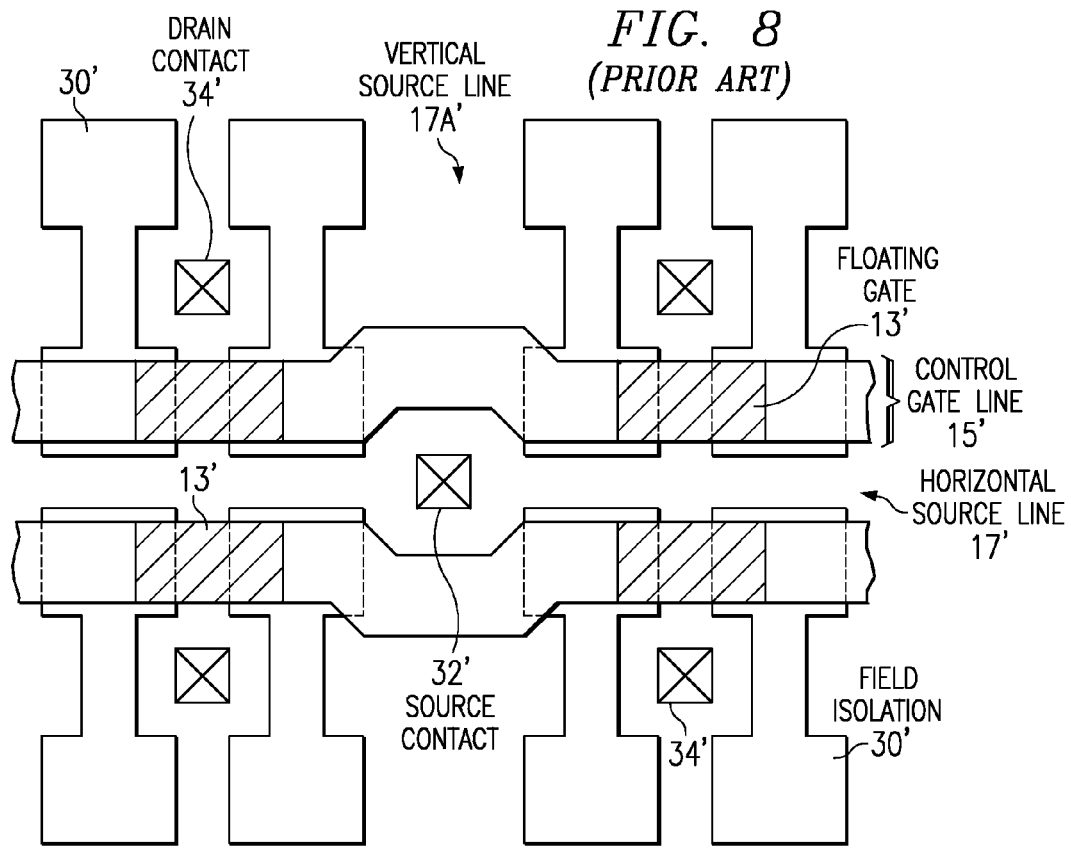
FIG. 8 shows a layout according to the prior art.

When the array is produced as a commodity (i.e., stand-alone memory) the isolation structures for the array are generally of thermally grown field oxide, the well-known LOCOS isolation. The fabrication process will typically use a P-type silicon substrate. It will start with growth of a pad oxide layer about 40 nm thick, which is grown or deposited, followed by CVD deposition of a nitride layer. The nitride is patterned and plasma-etched to expose the areas where field isolations are to be formed, typically in the "dog bone" pattern shown in FIGS. 8 and 4. A boron implant is performed to create channel stops, then the thick field oxide is thermally grown in a localized oxidation process to a thickness of 600-1,000 nm, using steam at 900 degrees C. and one atmosphere for several hours. Alternatively, a high pressure oxidation (HIPDX) can be used to decrease the oxidation time.

Following removal of the nitride and pad oxide layers, a Vt adjust implant is performed and a gate oxide is formed. A layer of polycrystalline silicon, which will form the floating-gate, is then deposited to a thickness of 100-200 nm, and, if desired, doped and annealed. The flow thus far has been conventional.

The mask for the poly 1 layer is modified, so that at the same time the slot of the floating gates are patterned and etched, the poly 1 layer is removed where the stack will cross over the vertical source line. Once this etch is complete, but before the mask is ashed, an arsenic implant is performed. This arsenic implant will ensure conduction under the stack between the vertical source line and the horizontal source line. The area covered by the arsenic implant are shown as areas 40 in FIG. 1.

Processing then continues conventionally, with deposition of an inter-level insulator layer, such as oxide/nitride/oxide (ONO) of thickness in the range of 20-40 nm. An N+ doped polysilicon layer and an optional silicide layer, each typically 150-300 nm thick, are then formed over the insulator layer. A cap oxide layer is deposited, followed by patterning and etch of the layers to form the control gate/floating gate stack.

The next step is to implant the source and drain regions. The drain region is protected by photoresist while a source implant is done, typically with phosphorous and arsenic. The resist is then stripped and the source is protected by resist while the drain is implanted, typically with arsenic and boron.

An oxide layer can be formed after this process on the sides and top of the stack for improved data retention. An interlevel dielectric is then deposited over the face of the slice, and resist is deposited and patterned for the etch to the contacts.

Second Embodiment

LOCOS with Self-Aligned Source (SAS)

A second embodiment is very similar to the first embodiment, except that, as geometries decrease, continuous, equal-width LOCOS isolations are grown, rather than the separate "dog bone" of the previous embodiment. In order to form the horizontal source line, a mask is deposited and developed to expose the area which is to be the horizontal source line. An etch is performed to remove the field oxides in this line, then the mask is left in place while a self-aligned source implant is performed, producing a continuous horizontal source line.

Third Embodiment

STI

When an embedded FLASH array is produced, its formation will be integrated with the process to form the logic, which often uses shallow trench isolations (STI). In this embodiment, rather than growing field oxides, shallow trenches are etched in the silicon, then filled with a deposited dielectric, such as silicon dioxide, to provide the electrical isolation between cells. Other parameters remain the same.

According to a disclosed class of innovative embodiments, there is provided: A nonvolatile memory array, comprising: a plurality of diffused horizontal source lines, parallel to and interspersed with parallel control gate lines; and a diffused vertical source line which intersects plural ones of said diffused horizontal source lines, said diffused vertical source line being flanked by isolation structures; wherein said horizontal source lines are electrically connected to said vertical source line by dopants implanted under said control gate lines.

According to another disclosed class of innovative embodiments, there is provided: A non-volatile memory array, comprising: a plurality of diffused horizontal source lines, parallel to and interspersed with parallel control gate lines; and a diffused vertical source line which intersects plural ones of said diffused horizontal source lines, said diffused vertical source line being flanked by isolation structures, wherein said horizontal source lines are separated from said vertical source line by said control gate lines; a plurality of drain contacts separated from respective ones of said horizontal source lines by a respective control gate line, said control gate line containing individual floating gates; and a source contact which is located in said vertical source line and is substantially in line with ones of said drain contacts; wherein said source contact is electrically connected to said horizontal source line by dopants implanted under said respective control gate lines.

According to another disclosed class of innovative embodiments, there is provided: A method of fabricating a nonvolatile memory array, comprising the steps of: (a.) forming substantially parallel isolation structures in proximity to a surface of a substantially monolithic semiconductor material, said isolation structures at least partially defining horizontal source lines and a vertical source line which intersects ones of said horizontal source lines; (b.) forming a first conductive layer on said substantially monolithic body of semiconductor material; (c.) etching said first conductive layer to define an edge of floating gate structures and to expose a portion of said semiconductor material in laid vertical source line;
(d.) after step (c.), implanting dopants into said exposed portion of said vertical source line; (e.) after step (d.), forming a second conductive layer overlying said first conductive layer; (f.) etching said first and second layers to form floating gate and control gate structures which intersect said isolation structures.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Alternatively, the layers in the gate stack could be different materials other than those listed above, or additional layers added.

Alternatively, other metallizations can be used, such as copper.

Alternatively, other dopants can be used, or in different combinations than stated.

What is claimed is:

1. A method of fabricating a nonvolatile memory array, comprising the steps of:
    (a.) forming substantially parallel isolation structures in proximity to a surface of a substantially monolithic semiconductor material, said isolation structures at least partially defining horizontal source lines and a vertical source line which intersects ones of said horizontal source lines;
    (b.) forming a first conductive layer on said substantially monolithic body of semiconductor material;
    (c.) etching said first conductive layer to define an edge of floating gate structures and to expose a portion of said semiconductor material in said vertical source line;
    (d.) after step (c.), implanting dopants into said exposed portion of said vertical source line;
    (e.) after step (d.), forming a second conductive layer overlying said first conductive layer;
    (f.) etching said first and second layers to form floating gate and control gate structures which intersect said isolation structures.

2. The method of claim 1, wherein said dopants comprises arsenic.

3. The method of claim 1, wherein said step (c.) exposes substantially all of said vertical source line.

4. The method of claim 1, wherein said step (c.) exposes only that portion of said vertical source line which will lie under said control gate structures.

5. The method of claim 1, further comprising the step of:
    (g.) forming a source contact which is located within said vertical source line, but not in said plurality of horizontal source lines.

* * * * *